(12) United States Patent
Mizoguchi

(10) Patent No.: US 11,060,191 B2
(45) Date of Patent: Jul. 13, 2021

(54) METHOD FOR PRODUCING HOLLOW STRUCTURE, PLATED COMPOSITE, AND HOLLOW STRUCTURE

(71) Applicant: ASAHI DENKA KENKYUSHO CO., LTD., Tokyo (JP)

(72) Inventor: Masanori Mizoguchi, Tokyo (JP)

(73) Assignee: ASAHI DENKA KENKYUSHO CO., LTD., Tokyo (JP)

( * ) Notice: Subject to any disclaimer, the term of this patent is extended or adjusted under 35 U.S.C. 154(b) by 0 days.

(21) Appl. No.: 16/331,188

(22) PCT Filed: Feb. 22, 2018

(86) PCT No.: PCT/JP2018/006581
§ 371 (c)(1),
(2) Date: Mar. 7, 2019

(87) PCT Pub. No.: WO2018/155592
PCT Pub. Date: Aug. 30, 2018

(65) Prior Publication Data
US 2019/0218667 A1    Jul. 18, 2019

(30) Foreign Application Priority Data

Feb. 25, 2017   (JP) .............................. JP2017-034212
Jun. 13, 2017   (WO) ................. PCT/JP2017/021876

(51) Int. Cl.
*C25D 5/44* (2006.01)
*C25D 1/02* (2006.01)
(Continued)

(52) U.S. Cl.
CPC ...... *C23C 18/1657* (2013.01); *C23C 18/1637* (2013.01); *C23C 18/1641* (2013.01);
(Continued)

(58) Field of Classification Search
CPC ........................................................ C25D 5/48
(Continued)

(56) References Cited

U.S. PATENT DOCUMENTS 4,221,643 A * 9/1980 Miles ...................... C25B 11/00
                                                          205/223
4,464,231 A * 8/1984 Little ....................... C25D 5/50
                                                          164/132
(Continued)

FOREIGN PATENT DOCUMENTS

JP    S4953540 A    5/1974
JP    H06179983 A   6/1994
(Continued)

OTHER PUBLICATIONS

Translation of International Search Report dated May 29, 2018 and Written Opinion in corresponding International application No. PCT/JP2018/006581; 4 pages.

*Primary Examiner* — Brian W Cohen
(74) *Attorney, Agent, or Firm* — Maier & Maier, PLLC

(57) ABSTRACT

A method for producing a hollow structure useful as a base material for a heat sink or the like which increases a heat dissipation property of devices mounted in various kinds of electronic apparatuses, without sacrificing downsizing, thinning, weight reduction, and multifunctionality, and provides a hollow structure. The method including: producing a plated composite by coating a surface of a core made of aluminum to form a copper plating layer; cutting off part of the plated composite to expose cut surfaces of the core; and turning a part corresponding to the core into a hollow part by immersing the plated composite in a sodium solution which dissolves aluminum but does not dissolve copper and selectively dissolving and removing only the aluminum, thereby (Continued)

producing a hollow structure whose skeletal part is composed of all copper plating layers.

9 Claims, 8 Drawing Sheets

(51) Int. Cl.
  *C25D 5/48*  (2006.01)
  *C23C 18/16*  (2006.01)
  *C23C 18/18*  (2006.01)
  *C25D 3/38*  (2006.01)
  *C23C 18/38*  (2006.01)
  *C25D 1/08*  (2006.01)
  *C23F 1/00*  (2006.01)
  *C23C 18/54*  (2006.01)
(52) U.S. Cl.
  CPC ...... *C23C 18/1646* (2013.01); *C23C 18/1689* (2013.01); *C23C 18/1834* (2013.01); *C23C 18/38* (2013.01); *C23F 1/00* (2013.01); *C25D 1/02* (2013.01); *C25D 1/08* (2013.01); *C25D 3/38* (2013.01); *C25D 5/44* (2013.01); *C25D 5/48* (2013.01); *C23C 18/54* (2013.01)
(58) Field of Classification Search
  USPC .......................................... 205/223
  See application file for complete search history.

(56) References Cited

U.S. PATENT DOCUMENTS

| | | |
|---|---|---|
| 5,317,805 A | 6/1994 | Hoopman et al. |
| 2005/0093140 A1 | 5/2005 | Kim |
| 2018/0143673 A1* | 5/2018 | Jenkins ................ F28F 21/085 |
| 2018/0164042 A1* | 6/2018 | Stellman ................ B22D 19/02 |

FOREIGN PATENT DOCUMENTS

| | | |
|---|---|---|
| JP | H09505388 A | 5/1997 |
| JP | 2005129891 A | 5/2005 |

\* cited by examiner (a)

(b)

(a)

(b)

METHOD FOR PRODUCING HOLLOW STRUCTURE, PLATED COMPOSITE, AND HOLLOW STRUCTURE

FIELD

The present invention relates to a method for producing a hollow structure useful as a radiator (a heat sink, a heat pipe, a vapor chamber) or the like assembled in various small, thin, and multifunctional semiconductor devices and to a plated composite and a hollow structure. More particularly, it relates to a method for producing a hollow structure which is developed using metal as a temporary plating core, a joining method of plating this metal with another kind of metal, and a difference in solubility in a specific solvent between these metals, and to a plated composite, and a hollow structure.

BACKGROUND

As various kinds of portable information terminals and electronic apparatuses such as desktop personal computers, tablets, and smartphones are rapidly becoming smaller, thinner, more multifunctional, and lighter-weighted, their information processing volumes and information transmission volumes are increasing and their information processing speeds and information transmission speeds are also becoming higher. In accordance with this, heat generation amounts of devices mounted in these apparatuses are also increasing, and studies are being made on a measure for reducing a temperature increase of devices such as CPU assembled in these apparatuses. In this case, it is also pursued at the same time not to sacrifice the aforesaid characteristics of these apparatuses, such as the small size, small thickness, multifunctionality, and light weight.

Implemented examples of such a measure are to assemble a cooling fan in an apparatus to dissipate heat of devices by the operation of the cooling fan, and to bring a heat generating portion of a device into direct contact with a heat sink made of aluminum or copper having good thermal conduction or connect the heat generating portion to the heat sink through a heat pump to make the heat sink absorb the heat generation of the device, thereby dissipating the heat.

In these measures, however, if the device generates a large amount heat, the cooling fan needs to be large, or the heat sink needs to have a large thickness or a large planar shape so that a heat capacity as the heat sink increases. This results in an increased space occupied by the whole cooling fan or heat sink in the apparatus, which involves a problem that the kind or the number of mounted devices is limited. This is against the requirement for the light weight, small size, small thickness, and multifunctionality required of the apparatus.

Under such circumstances, there has been proposed a heat spreader in which two heat-transfer thin sheets are disposed to face each other with a predetermined space therebetween, a vibration generating means is interposed between the thin sheets, a heat transfer medium is enclosed in the space, and the whole peripheral end portion has a liquid-tight structure (refer to Patent Document 1).

PRIOR ART DOCUMENT

Patent Document

Patent Document 1: Japanese Patent Application Laid-open No. 2005-129891

SUMMARY

It can be said that the structure of the aforesaid prior art as a whole is more thinned and has a higher heat dissipation property owing to the work of the heat transfer medium enclosed in the internal space, as compared with conventional heat sinks. However, it has the following problems.

Firstly, constituent members such as the two heat-transfer thin sheets and the vibration generating means have to be produced and prepared as separate members, and it is necessary to assemble these into the liquid-tight structure and form the internal space between the thin sheets. Accordingly, in the assembling step of the structure, after the constituent members are arranged in a predetermined positional relation, a delicate, careful, and troublesome work such as laser welding needs to be applied to the peripheral edge portion of the structure in order to make the whole structure liquid-tight. These problems are more troublesome as the structure has a more complicated shape, and in view of actual mass production-industrialization issues, they can be said as problems to be solved.

The present invention has an object to provide a technique to produce a hollow structure whose main body is made of plating metal, by a plating method of plating a core with metal and by forming a hollow part by dissolving and removing only the core utilizing a difference in solubility between the core and the plating in a specific solvent, without requiring the step of assembling constituent members as is required in the aforesaid prior art, in particular, to provide a technique suitable for producing a thin or small-diameter hollow structure easily and at low cost.

Means for Solving the Problems

In order to solve the aforesaid problems, the present invention provides a method for producing a hollow structure, the method including:

producing a plated composite which is formed by plating a surface of a core and which has a plating layer, the plated composite having part of the core exposed from the plating layer; and next, turning a part corresponding to the core into a hollow part by dissolving and removing the core by a solvent which dissolves the core but does not dissolve the plating layer, thereby producing a hollow structure whose skeletal part is the plating layer.

Preferably, the core is metal or synthetic resin.

Preferably, the core has a 0.001 to 1 mm thickness, and the plating layer has a 0.001 to 1 mm thickness.

Preferably, as the core, one having at least one through hole formed in a thickness direction is used.

Preferably, as the core, one having a surface on at least part of which an irregular portion is formed is used.

Preferably, as the core, one with which a sheet-shaped member made of a material insoluble in the solvent is integrated is used, and the sheet-shaped member is left in the hollow part.

Preferably, the method includes covering at least part of the surface of the core with a corrosion-resistant metal layer excellent in corrosion resistance and insoluble in the solvent before the plating, to cover at least part of an inner surface of the skeletal part made of the plating layer with the corrosion-resistant metal layer.

Preferably, the method further includes a step of enclosing a heating medium in the hollow part in order for the hollow structure to be used as a radiator for an electronic apparatus.

The present invention further provides a plated composite used for producing a hollow structure, the plated composite including: a core; and a plating layer covering a surface of the core, wherein the core is partly exposed from the plating layer, in order for a part corresponding to the core to be turned into a hollow part by dissolving and removing the core by a solvent which dissolves the core but does not dissolve the plating layer, and in order for the plating layer to be a skeletal part of the hollow structure.

Preferably, the core of the plated composite has a 0.001 to 1 mm thickness, and the plating layer has a 0.001 to 1 mm thickness.

Preferably, the core of the plated composite has a surface on at least part of which an irregular portion is formed.

Preferably, a sheet-shaped member which is made of a material insoluble in the solvent and which is to be left in the hollow part is integrated with the core of the plated composite.

Preferably, a corrosion-resistant metal layer excellent in corrosion resistance and insoluble in the solvent is interposed between the core and the plating layer of the plated composite to cover at least part of the surface of the core.

The present invention further provides a hollow structure produced using a plated composite in which a surface of a core except for part is covered with a plating layer, the hollow structure including: a hollow part constituted by a part corresponding to the core dissolved and removed by a solvent which dissolves the core but does not dissolve the plating layer; and a skeletal part constituted by the plating layer.

Preferably, a heating medium is enclosed in the hollow part of the hollow structure.

Preferably, an interval between opposed inner surfaces of the hollow part which interval corresponds to a thickness direction of the core of the hollow structure is 0.001 to 1 mm, and the skeletal part has a 0.001 to 1 mm thickness.

Preferably, at least part of the inner surface of the hollow part of the hollow structure has an irregular portion.

Preferably, a sheet-shaped member made of a material insoluble in the solvent is inserted and disposed in the hollow part of the hollow structure.

Preferably, in the hollow structure, at least part of an inner surface of the skeletal part constituted by the plating layer is covered with a corrosion-resistant metal layer excellent in corrosion resistance and insoluble in the solvent.

Preferably, the hollow structure is used as a radiator, a cable, or a metal tube for an electronic apparatus.

Effect of the Invention

According to the present invention, it is possible to produce the hollow structure having the hollow part therein, without mechanically assembling heat-transfer thin sheets and so on. In this case, by appropriately setting the shape and thickness of the used core and the thickness of the plating layer covering the core, it is possible to produce a hollow structure having a complicated shape and a hollow structure which is downsized, thinned, and reduced in diameter as a whole. Further, by appropriately selecting the thickness of the core ("thickness" includes "diameter" in a case where the core is bar-shaped or cylindrical) and its shape, it is possible to arbitrarily set the size of the sectional area of the formed hollow part and the space volume of the whole hollow part. Further, by appropriately setting the thickness of the plating layer, it is possible to arbitrarily adjust the strength, heat capacity, and weight of the formed skeletal part. Further, if a method to melt and remove the core by heat is adopted, especially in a case of a structure having a narrow hollow part and a long depth, a solvent in which the core is molten is cooled to be solidified before being discharged out and thus cannot be smoothly discharged, and may remain in the space in a relatively large amount. On the other hand, in the present invention, since the core is dissolved by the solvent, the core is not solidified during a process of discharging it, and can be quickly discharged with almost no residue of the solvent of the core in the hollow part. This makes the present invention suitable for producing a thin hollow structure and a hollow structure having a complicated shape like those described above.

In particular, using the core having the through hole in the thickness direction is preferable because, in the formed skeletal part, the cylindrical plating layer is formed also on a wall surface of the through hole, and its upper and lower ends are coupled to and integrated with the plating layers respectively forming an upper surface portion and a lower surface portion of the skeletal part, so that, between the plating layers as the upper surface portion and the lower surface portion in the obtained hollow structure, this cylindrical plating layer also exhibits a reinforcing operation as a thickness-direction stay which prevents deflection.

Further, the hollow structure of the present invention achieves downsizing, a diameter reduction, thinning, and a weight reduction as a radiator such as a heat sink, a heat pipe, or a vapor chamber. Further, being capable of having an extremely thin or slender structure, it is suitable especially as a radiator loaded or built in various kinds of electronic apparatuses (electric control machines and apparatus, power distribution or control machines and apparatus, telecommunication machines and apparatus, portable information terminals, smartphones, computers, power modules, other electronic appliances, and so on) which require downsizing. Further, in a case where the present invention is applied to a cable (in particular, a high-speed transmission cable) for transmitting power or information, permittivity is stable all over the length because the cable can be a thin hollow structure, which is suitable for high-speed transmission of a large volume of data.

BRIEF DESCRIPTION OF DRAWINGS

FIG. 5($b$) is a partially cutaway sectional view illustrating a hollow structure in which the corrosion-resistant metal layer is formed on inner surfaces of the copper plating layer.

FIG. 6($b$) is a perspective view illustrating a cylindrical hollow structure.

FIG. 7(b) is a view illustrating an example of a core having an irregular portion.

DETAILED DESCRIPTION

Figure 1:
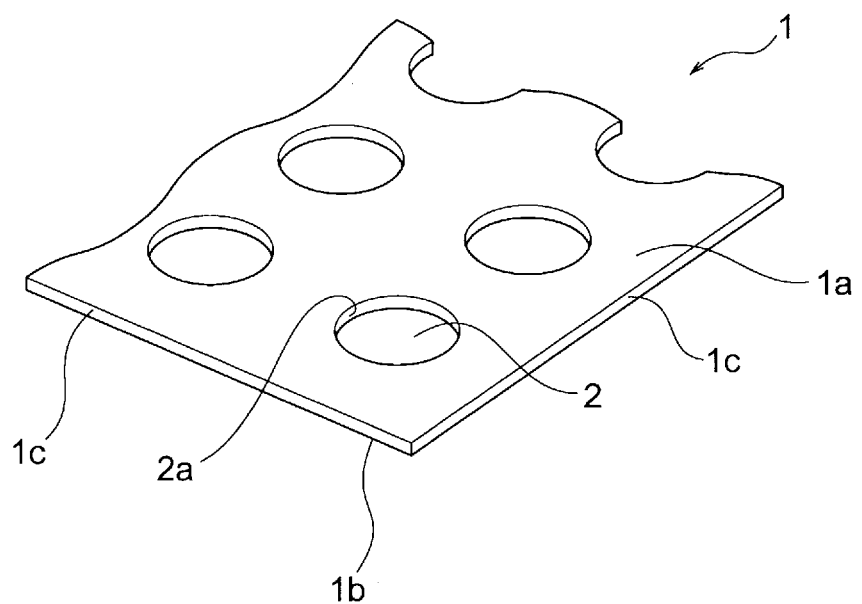
FIG. 1 is a partially cutaway perspective view illustrating an example of a core made of aluminum according to one embodiment of the present invention.

To produce a hollow structure, a later-described core is first prepared. In this embodiment, a plating layer covering the whole surface of the core is formed, and the plating layer is partly cut off, whereby a plated composite in which a cut surface of the core is exposed is produced.

Next, the plated composite whose core is partly exposed is immersed in a later-described solvent, whereby only the core is selectively dissolved and removed. Due to this immersion process, in the finally obtained hollow structure, a part corresponding to the core of the plated composite is turned into a hollow part and the plating layer is left as it is, so that a skeletal part having an integrated structure composed of a plating layer as an upper surface portion, a plating layer as a lower surface portion, and a cylindrical plating layer (in a case where a through hole is formed in the core) coupling the both plating layers is formed.

What is important here is the selection of a material of the core, a material forming the plating layer, and the solvent used in the immersion process of the plated composite.

As the core, metal or synthetic resin soluble in the solvent used in the immersion process is selected. Then, as the material forming the plating layer, metal insoluble in the solvent used in the immersion process is selected. Accordingly, as the solvent used in the immersion process, a solvent which dissolves the core but does not dissolve the plating layer is selected.

As the solvent, either of an alkaline aqueous solution or an acid aqueous solution is usable, but either of these is selected according to the combination of the material of the core and the material forming the plating layer.

In a case where, for example, the alkaline aqueous solution is selected as the solvent used in the immersion process, amphoteric metal soluble in the alkaline aqueous solution, for example, aluminum or zinc, is selected as the core, and metal such as copper, nickel, or chromium insoluble therein is selected as the plating layer. To put it the other way around, in the case where the aforesaid metals are selected as the core and the plating layer, the alkaline aqueous solution is selected as the solvent used in the immersion process. Examples of such an alkaline aqueous solution include a sodium hydroxide solution and a potassium hydroxide solution. As the core, not only metal but also synthetic resin is usable, and an example of the usable synthetic resin is polyimide as a material soluble in the alkaline aqueous solution.

Incidentally, in a case where the obtained hollow structure is used as a radiator (a heat sink, a heat pipe, or the like), it is preferable to select aluminum or polyimide as the core, select copper having an excellent heat transfer property as the material forming the plating layer, and select a sodium hydroxide or polyimide etching solution as the alkaline aqueous solution.

Hereinafter, a case where a heat sink is produced by selecting a core 1 made of aluminum and a plating layer formed of copper plating (copper plating layer 3) will be described based on the drawings.

The core may be a flat plate material or foil having an arbitrary thickness, but as illustrated in FIG. 1, it preferably has one through hole 2 or more formed in a thickness direction from an upper surface portion 1a toward a lower surface portion 1b of the core 1. A reason for this will be described later. A suitable sectional shape of these through holes 2 is circular as illustrated in FIG. 1, but the shape thereof is not limited to this, and may be any shape such as, for example, a triangle, a quadrangle, an ellipse, or other modified sectional shape. Such through holes 2 can be formed by mechanical punching or drilling, or can be formed using photolithography and etching techniques, for instance.

Figure 2:
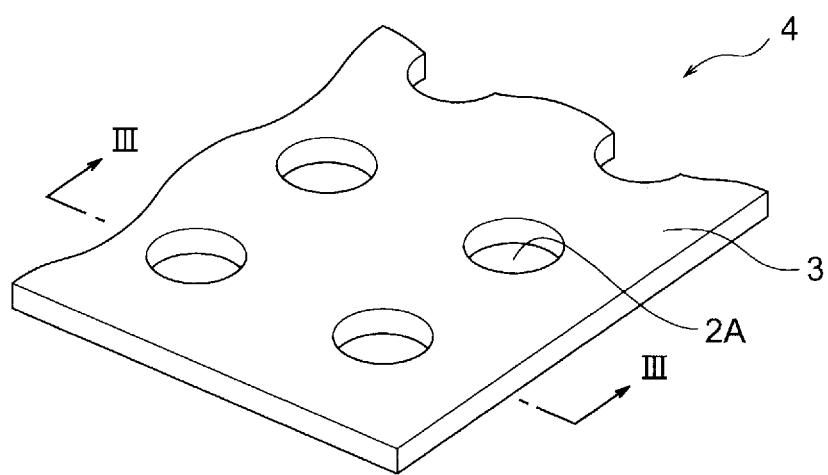
FIG. 2 is a partially cutaway perspective view illustrating a plated composite according to one embodiment of the present invention in which a copper plating layer is formed all over a surface of the core in FIG. 1.

A core-plating composite member 4 illustrated in FIG. 2 is produced in which all surfaces of the core 1, that is, the upper surface portion 1a, the lower surface portion 1b, and peripheral surface portions 1c, and wall surface portions 2a of the through holes 2 are covered with the copper plating layer 3 having a desired thickness. As compared with the core 1 in FIG. 1, the core-plating composite member 4 has a larger thickness by the thickness of the formed copper plating layer 3 and also has longer width and length, and the diameter of its through holes 2A is smaller than the diameter of the through holes 2.

Incidentally, the copper plating layer 3 can be formed by an ordinary electrolytic plating method using a copper plating bath or an electroless plating method. In this case, the surface of the core 1 made of aluminum is covered with a passive film and if it is left as it is, the copper plating layer may not be electrodeposited thereon uniformly, and therefore, it is preferable to pre-treat the whole surface of the core 1 using, for example, zinc substitution or an acid cleaner prior to the plating so that the copper plating layer 3 is formed on the whole surface of the core 1 as uniformly as possible. Incidentally, in this embodiment, since the core 1 made of aluminum is finally dissolved, adhesion strength between the core 1 and the copper plating layer 3 need not be high. Therefore, as the pre-treatment, only the immersion in the acid cleaner is enough, and consequently, it is possible to greatly reduce the cost for the plating.

Further, by selecting a copper concentration in the copper plating bath used in the plating, a current density adopted in the plating, the plating time, and so on, it is possible to arbitrarily adjust the thickness of the formed copper plating layer 3. For example, by setting the plating time long, it is possible for the plating layer to have a large thickness, and conversely, by shortening the plating time, it is possible for the plating layer to have a small thickness. Further, it is also possible to make the copper plating layer 3 on the upper surface portion 1a and that on the lower surface portion 1b of the core 1 different in thickness or to partially change the thickness of the copper plating layer 3.

Next, the core-plating composite member 4 produced in this manner is partly cut off to be made into a plated composite 4A of this embodiment in which a cut surface of the core 1 made of aluminum is exposed. Note that the number of places where it is cut is not limited to one, but it may be cut at a plurality of appropriate places.

Figure 3:
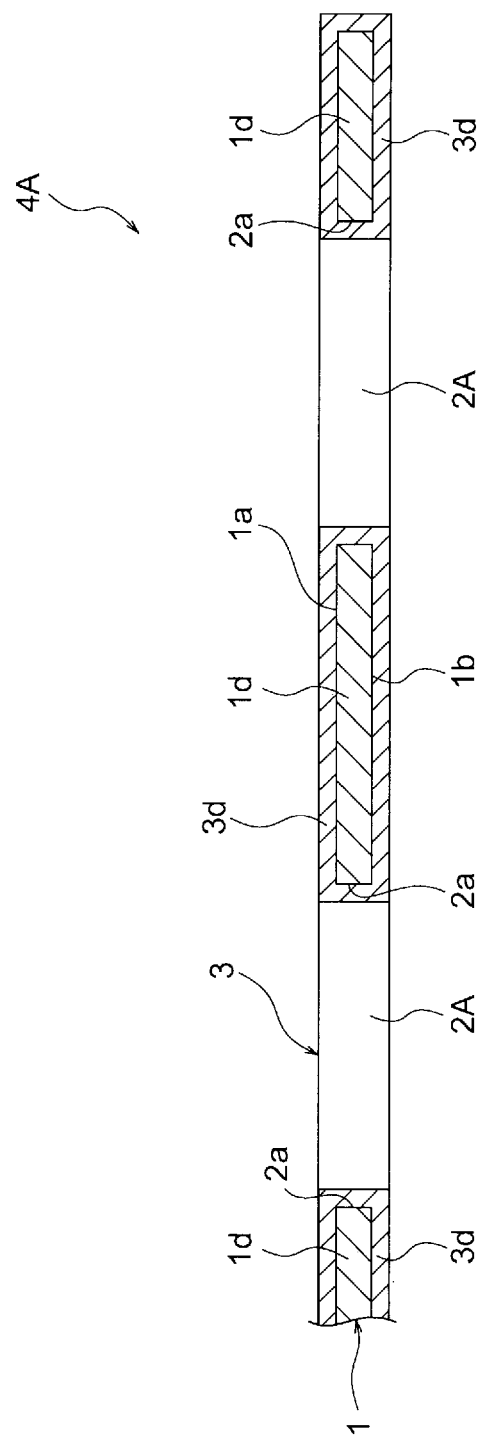
FIG. 3 is a sectional view taken along the line in FIG. 2.

For example, in a case where the core-plating composite member 4 is cut along the III-III line including part of the through holes 2A in FIG. 2, a cut surface of the plated composite 4A obtained after the cutting has the sectional structure illustrated in FIG. 3. Specifically, in the cut surface of the plated composite 4A, cut surfaces 1d of the core 1 itself are exposed at the same time with cut surfaces 3d of the copper plating layer 3 having an integrated structure in which the copper plating layers 3 formed on the upper surface portion 1a and the lower surface portion 1b of the core 1 and on the wall surface portions 2a of the through holes 2 in FIG. 1 are coupled. However, the wall surfaces of portions of the through holes 2A not cut off are left covered with the copper plating layer 3. In this manner, in the plated composite 4A, most of the core 1 is covered or surrounded with the copper plating layer 3, but the aluminum forming the core 1 is exposed only at the portions corresponding to the cut surfaces 1d.

Next, this plated composite 4A is subjected to an immersion process in a solvent. As the solvent, an alkaline aqueous solution is used. In particular, a sodium hydroxide solution is suitable When the plated composite 4A is immersed in, for example, the sodium hydroxide solution, the core 1 whose cut surfaces 1d are exposed from the positions of the cut surfaces 3d of the copper plating layer 3 is dissolved in the aqueous solution because the core 1 is made of aluminum which is amphoteric metal. However, the copper of the copper plating layer 3 covering the core 1 is not dissolved. Then, while the dissolution of the copper plating layer 3 does not progress thereafter, the dissolution of only the plate material 1 made of aluminum in the aqueous solution progresses inward from the exposed cut surfaces 1d of the core 1, and finally, the core 1 is entirely dissolved in the plated composite 4A. A solution of the core 1 made of aluminum is discharged to the outside from the portions surrounded by the cut surfaces 3d of the copper plating layer 3 (the portions where the cut surfaces 1d of the core 1 were exposed) and consequently, the core 1 is removed.

Figure 4:
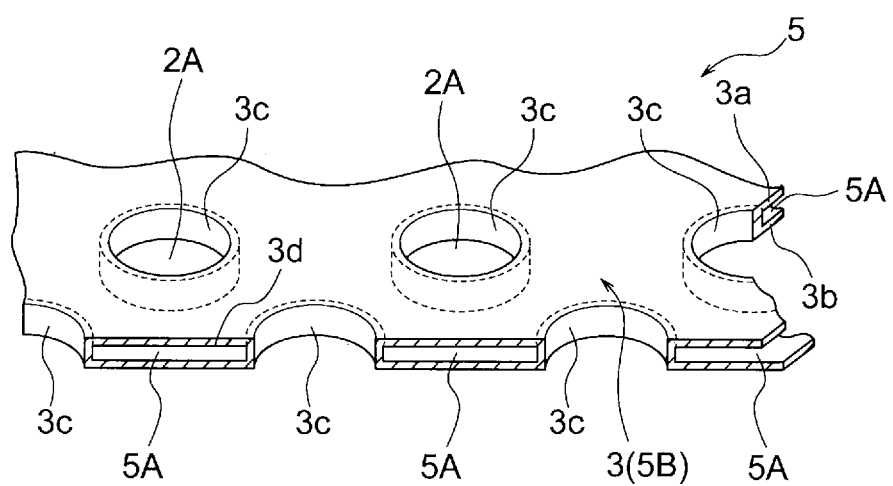
FIG. 4 is a partially cutaway sectional view illustrating a section of a hollow structure according to one embodiment of the present invention obtained after an immersion process in a solvent.

As a result, a hollow structure 5 in a plate shape is obtained in which the part where the core 1 made of aluminum was present turns into a hollow part 5A and the remaining copper plating layer 3 is turned into a skeletal part 5B surrounding the hollow part 5A as illustrated in FIG. 4. In this case, at the cut surfaces 1d of the core 1, opening portions of the hollow part 5A are located.

In this immersion process, it is suitable that, for example, a sodium concentration in the sodium solution is set to 5 to 30%, a solution temperature is kept at 30 to 80° C., and the solution is stirred or is given vibration by an ultrasonic vibrator during the progress of the immersion process because this makes the dissolution of the core 1 made of aluminum smoothly progress.

For example, the core-plating composite member 4 illustrated in FIG. 2 is produced by using the 0.3 mm thick aluminum core 1 having the plural circular through holes 2 with a 3 mm diameter punched therein, and forming the 0.15 mm thick copper plating layer 3 by the electrolytic plating method to cover the whole surface of the core 1, thereafter the core-plating composite member 4 is cut into an about 20 mm width with part thereof being removed, whereby the plated composite 4A (FIG. 3) in which the cut surfaces 1d of the core 1 made of aluminum and the cut surfaces 3d of the copper plating layer 3 are exposed is produced, then the immersion process is applied to the plated composite 4A for about 30 to 180 minutes by immersing it in the sodium solution with a 10% concentration, keeping the solution temperature at 30 to 80° C., and giving 20 to 100 kHz ultrasonic vibration. Consequently, the thin, plate-shaped hollow structure 5 illustrated in FIG. 4 can be produced.

In this hollow structure 5, the hollow part 5A having the same shape as that of the used core 1 made of aluminum is formed inside the skeletal part 5B having the integrated structure of the copper plating layer 3 with a 0.15 mm thickness, and at its end portion, the opening portions of the hollow part 5A (their height (interval between opposed inner surfaces of the hollow part 5A) is 0.3 mm)) are located. The entire thickness is 0.6 mm (0.15 mm×2+0 3 mm), and the thinning is achieved as a whole.

The copper plating layers 3c forming the wall surfaces of the through holes 2A stand upright between the copper plating layer 3a as the upper surface and the copper plating layer 3b as the lower surface while integrated with these copper plating layers 3a, 3b, and accordingly, even if an excessive surface pressure is given from/to the copper plating layers 3a, 3b in, for example, an up and down direction, the copper plating layers 3c which stand upright exhibit a reinforcing operation as stays for preventing the deflection of the copper plating layers 3a, 3b.

The hollow structure 5 thus produced is usable as it is as a radiator (a heat sink or the like) for an electronic apparatus, but is usable as a radiator in which the hollow part 5A is filled with a heating medium (for example, a coolant (such as water) for cooling). In this case, the heating medium can be filled from the opening portions of the hollow part 5A, and thereafter the opening portions can be sealed using a means such as, for example, caulking, pressing, welding, heat seal, or soldering. It is easy for the hollow structure 5 to have a liquid-tight structure only by sufficiently sealing the opening portions because of the integrated structure of the copper plating layers 3a, 3b, 3c.

Being thin as a whole, the obtained radiator can be disposed even in a narrow space. Further, since its whole planar shape is determined by the planar shape of the used core which is a starting member, it can be easily usable even as a heat sink having a complicated shape. Moreover, the hollow structure can be easily produced by the plating technique and the immersion process in the solvent as described above. Further, in the case of the structure having the heating medium (coolant) filled in the hollow part, when the hollow structure is combined with devices of an electronic apparatus, it exhibits a more excellent effect of dissipating the heat of the heat generating devices owing to the work of the heating medium.

As described above, according to this embodiment, in the case where the interval between the opposed inner surfaces of the hollow part 5A is extremely narrow such as 0.3 mm, the used core 1 also has a very small thickness of 0.3 mm in conformity with the interval, and if the core 1 is made of aluminum as in this embodiment, a solution resulting from its dissolution in the alkaline aqueous solution has a very low viscosity, and even from narrow spaces, the solution can quickly flow out from the opening portions which have turned into the hollow part 5A and are surrounded by the cut portions 3d of the copper plating layer 3. Consequently, even though the plurality of copper plating layers 3c constituting the stays which become obstacles to the outflow stand upright between the copper plating layer 3a as the upper surface and the copper plating layer 3b as the lower surface, the aluminum solution quickly flows out without being obstructed by these copper plating layers 3c. Therefore, according to this embodiment, even if the interval between the opposed inner surfaces of the hollow part is very narrow, or even if the stay-shaped structures which obstruct the elusion are present inside, there remains almost no dissolved core 1, and even in the case where the heating medium is filled in the hollow part having a small volume, it is possible to fill the heating medium in an amount corresponding to the volume, making it possible to provide a radiator (a heat sink or a vapor chamber) having high performance in spite of its thin thickness (in the above example, the whole thickness is 0.6 mm). This also applies to a small-diameter heat pipe whose hollow part has, for example, an about 1 mm diameter.

In this embodiment, metal (aluminum or the like) or synthetic resin (polyimide or the like) soluble in the solvent is used as the core, and the skeletal part is formed by plating the core, thereby enabling the quick elusion from the narrow space as described above. The application of this embodiment is not limited, but it is suitable especially for obtaining a thin hollow structure. Specifically, it is suitable for producing, for example, a thin hollow structure in which, as the core 1, one having a 0.001 to 10 mm thickness is used, and the interval between the opposed upper and lower inner surfaces of the hollow part which interval corresponds to the thickness direction of the core is 0.001 to 10 mm, and the thickness of the plating layer, namely, the thickness of the skeletal part is 0.001 to 1 mm. Further, it is suitable especially for producing a very thin radiator in which the thickness of the core 1 and the interval between the opposed inner surfaces of the hollow part corresponding to the thickness direction of the core 1 is 0.001 to 5 mm, 0.001 to 3 mm, 0.001 to 1 mm, or even 0.001 to 0.5 mm. Therefore, it is suitable for being disposed in a very narrow space in an electronic apparatus. For example, by using an aluminum foil, a polyimide film, or the like having an about 0.01 mm thickness as the core 1 and setting the thickness of the plating layer stacked on its front surface side and rear surface side to about 0.01 mm, it is possible to obtain a very thin hollow metal foil whose total thickness including that of the hollow part is about 0.03 mm Incidentally, using a film made of synthetic resin such as polyimide as the core 1 is suitable for producing a thinner radiator in which the interval between the opposed upper and lower inner surfaces of the hollow part is 0.001 to 0.01 mm.

In the above description, after the core-plating composite member 4 is formed by covering the whole surface of the core 1 with the copper plating to layer 3, the plated composite 4A is formed by cutting off part of the core-plating composite member 4 to expose the cut surfaces 1d, and the core 1 is dissolved from the positions of the cut surfaces 1d. However, in the present invention, it is only necessary that part of the core 1 is exposed without being covered with the copper plating layer 3 in the stage of the plated composite 4A, so as to enable the core 1 to be dissolved, and for example, by masking part of the core 1 and thereafter plating the core 1, it is also possible to prevent the copper plating layer 3 from being formed on the masked portions. Alternatively, it is also possible to form the portions not covered with the copper plating layer 3 by preventing the portions of the core 1 from being immersed at the time of the immersion in the plating bath, without masking the portions.

Figure 5:
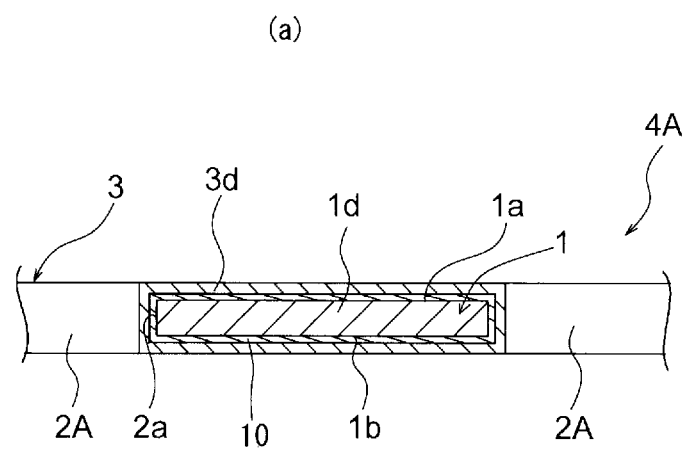
FIG. 5($a$) is a sectional view illustrating part of a plated composite including a corrosion-resistant metal layer.
Figure 5:
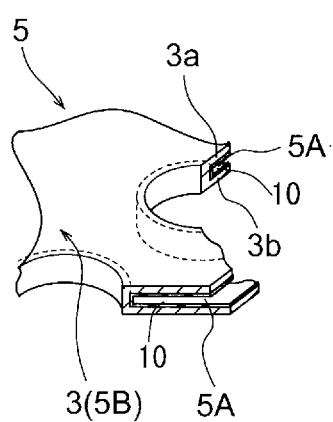

Further, in the above-described embodiment, the plated composite 4A is structured such that the surface of the core 1 is covered with the copper plating layer 3, but it may be structured such that a metal layer excellent in corrosion resistance (corrosion-resistant metal layer) 10 covering at least part of the surface of the core 1 is interposed between the core 1 and the copper plating layer 3, as illustrated in FIG. 5(a). Examples of a material of the corrosion-resistant metal layer 10 include those insoluble in the solvent in which the core 1 is dissolved, such as gold and silver, for instance. In the case where the corrosion-resistant metal layer 10 is provided, it is possible to form the plated composite 4A by, for example, covering the surface of the core 1 with any of these in advance by plating, sputtering, vapor deposition, or the like, and thereafter covering the surface of the corrosion-resistant metal layer 10 with the copper plating layer 3. In this case, part of the core 1 is exposed without being covered not only with the copper plating layer 3 but also with the corrosion-resistant metal layer 10, as in the above-described embodiment. As a method to expose the corrosion-resistant metal layer 10, any of means similar to the aforesaid various means for the exposure from the copper plating layer 3 is adoptable. Further, as in the above-described embodiment, as the plating layer, not only copper but metal such as nickel or chromium may be selected.

With the plated composite 4A having such a structure, after the immersion process in the solvent (potassium hydroxide solution or the like) which dissolves only the core 1 as in the above, the skeletal part 5B of the hollow structure 5 has the structure illustrated in FIG. 5(b) in which the inner surfaces of the copper plating layer 3 are covered with the corrosion-resistant metal layer 10. Therefore, in the application as a radiator having a heating medium (coolant) filled therein, such coating with the corrosion-resistant metal layer 10 is preferable for corrosion prevention. More preferably, the whole surface of the core 1 is covered with the corrosion-resistant metal layer 10 in advance so that all the inner surfaces of the copper plating layer 3 constituting the skeletal part 5B is covered therewith.

Figure 6:
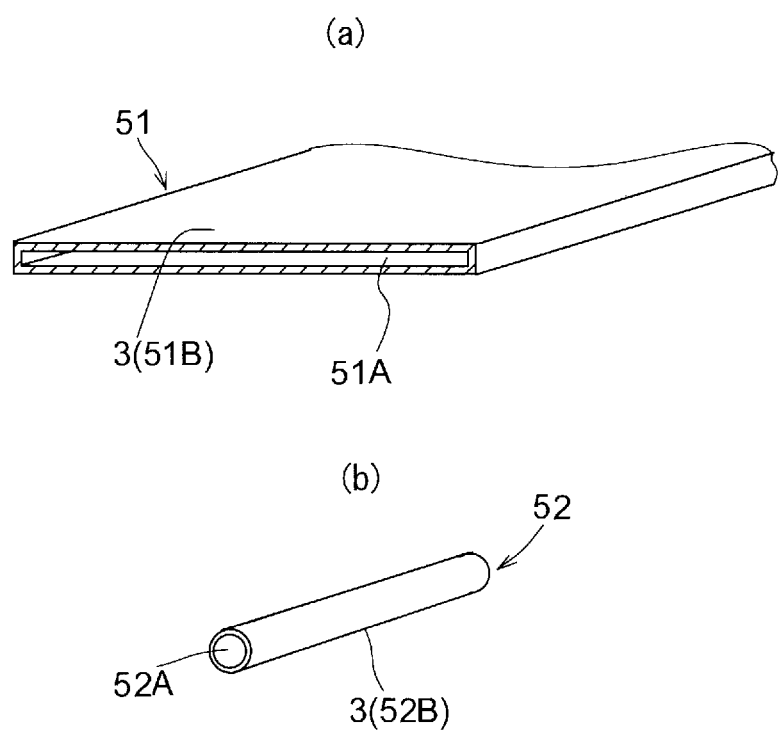
FIG. 6($a$) is a perspective view illustrating a section of a hollow structure in a flat-plate shape in which no copper plating layer corresponding to a stay is formed.

Further, in the above-described embodiment, the through holes 2 are formed in the core 1, and the copper plating layers 3c functioning as the stays are formed. Providing the copper plating layers 3c functioning as the stays can prevent the deflection or the like of the hollow structure 5 as described above, but depending on the thickness, area, or the like, it is of course possible to produce a hollow structure 51 including a hollow part 51A without any stay and constituted by a flat plate-shaped skeletal part 51B (copper plating layer 3) as illustrated in FIG. 6(a), by using, as the core, a flat plate in which no through hole is formed.

Further, the above embodiment mainly describes the application as the base material of the heat sink assembled in various kinds of electronic apparatuses which pursue the small size, small thickness, light weight, and multifunctionality, using the thin plate material, foil, or film as the core, but the application of the hollow structure is not limited to this, and it is also possible to form a small-diameter heat pipe by using a bar-shaped or needle-shaped one as the core. Further, by using a needle-shaped body made of aluminum as the core and forming a plating layer of metal having high hardness and excellent corrosion resistant, such as nickel or chromium, to cover the needle-shaped body, and thereafter dissolving and removing the needle-shaped body to produce a very thin metal tube, it is possible to use the metal tube as a base material of an inspection probe for semiconductor device inspection, for instance. FIG. 6(b) illustrates an example of a hollow structure 52 which is fabricated using such a bar-shaped or needle-shaped core and which is for use as a heat pipe, an inspection probe, or the like, and this hollow structure 52 is constituted by a cylindrical skeletal part 52B (copper plating layer 3) having a hollow part 52A. This method can also produce an electronic apparatus cable for the high-speed transmission of a large volume of power or information. In order to achieve stable permittivity in such a cable, the inside is desirably hollow, and the present invention can provide a cable constituted by a very thin or slender hollow structure by making the thickness of the core very small, or in the case where the core is needle-shaped, by making its diameter very small.

Figure 7:
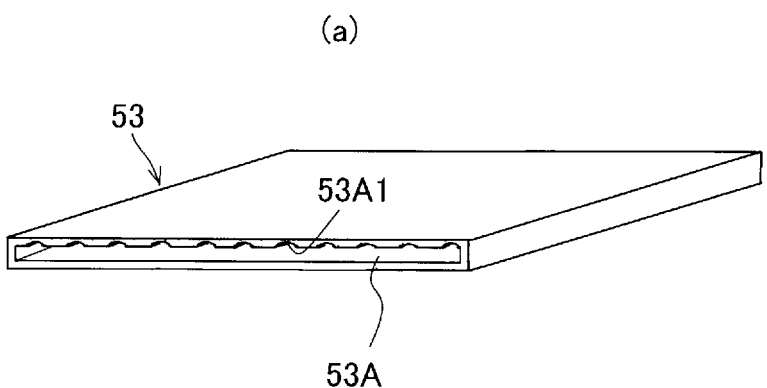
FIG. 7($a$) is a view illustrating a hollow structure according to another embodiment of the present invention.
Figure 7:
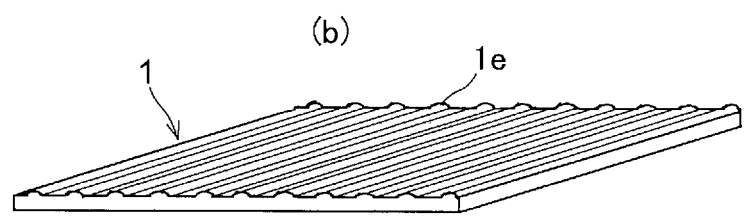

FIGS. 7(a), (b) are views illustrating a hollow structure 53 according to another embodiment. In a case where the hollow structure 53 is used as a radiator (a heat sink, a heat pipe, a vapor chamber, or the like), it is preferable that a hollow part 53A is filled with a heating medium (coolant) such as water and is sealed as described above, and especially in a case where an interval between opposed inner surfaces of the hollow part 53A is narrow, at least part of the opposed inner surfaces of the hollow part 53A preferably has an irregular portion 53A1 for the purpose of increasing the surface area and allowing the heating medium to smoothly move. A formation range of the irregular portion 53A1 is preferably as wide as possible, and it can be formed only on one of the opposed inner surfaces as illustrated in FIG. 7(a) or on both of the inner surfaces. The irregular portion 53A1 mentioned here includes those having various shapes such as, for example, a dimple shape, a groove shape, a line shape, a stripe shape, and a mesh shape, and these also include one functioning as a wick having a capillary action. It is possible to form such an irregular portion 53A1 in the hollow part 53A by forming an irregular portion 1e in a dimple shape, a groove shape, a line shape, a stripe shape, a mesh shape, or the like on at least part of a surface of a core 1 in advance as illustrated in FIG. 7(b). As a result of using the core 1 having such an irregular portion 1e and forming a copper plating layer 3 in the above-described manner, the irregular portion 1e of the core 1 is transferred to a position which is to be the inner surface of the hollow part 53A. Specifically, dented portions of the core 1 become projecting portions on the inner surface of the hollow part 53A, and projecting portions of the core 1 become dented portions on the inner surface of the hollow part 53A, so that the irregular portion 53A1 is formed, as illustrated in FIG. 7(a). More widening the formation range of the irregular portion 1e on the surface of the core 1 results in a wider formation range of the irregular portion 53A1 on the inner surface of the hollow part 53. Further, by forming the irregular portions 1e on both surfaces of the core 1, it is possible to form the irregular portions 53A1 on both of the opposed inner surfaces of the hollow part 53A.

Figure 8:
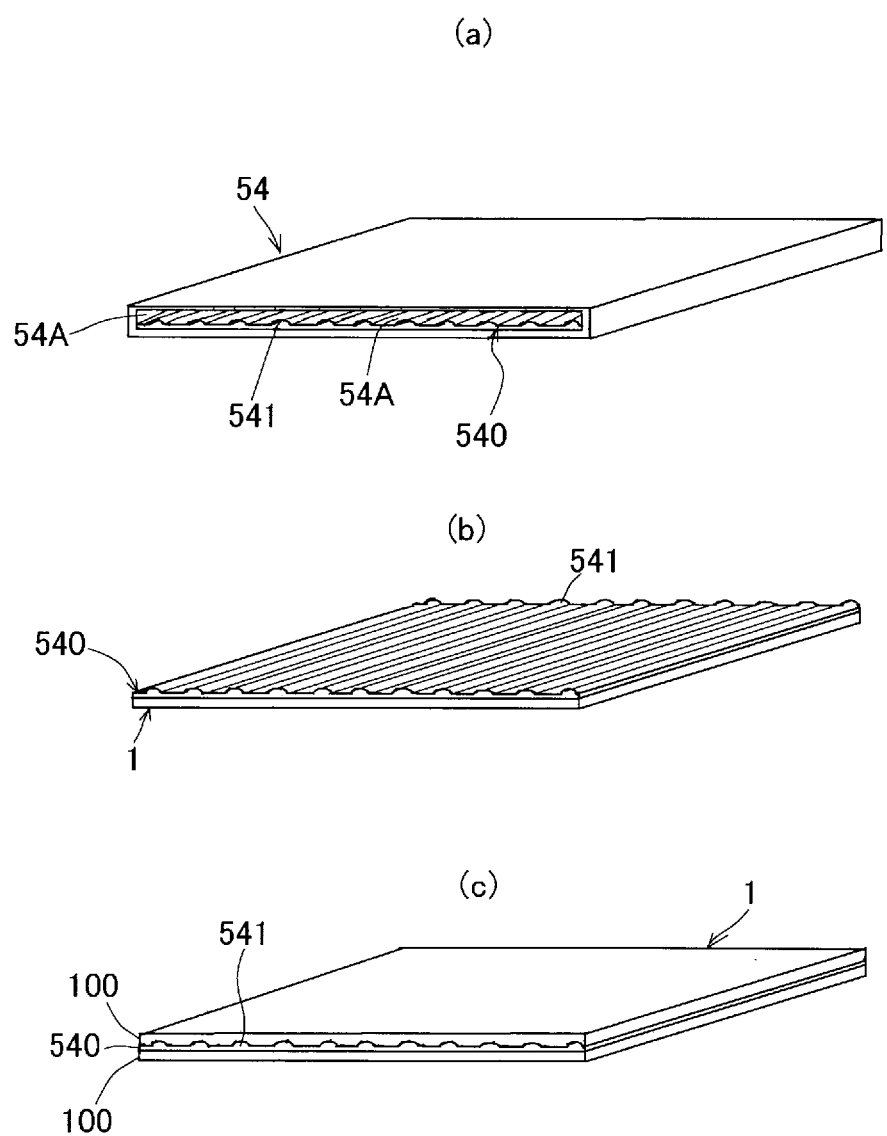
FIG. 8(a) is a view illustrating a hollow structure according to still another embodiment of the present invention.
FIG. 8(b) is a view illustrating a core with whose surface a sheet-shaped member is integrated.
FIG. 8(c) is a view illustrating a core sandwiching the sheet-shaped member.

FIGS. 8(a), (b) are views illustrating a hollow structure 54 according to still another embodiment. To produce the hollow structure 54, used is a core 1 having one surface to/with which a sheet-shaped member 540 having, on its surface, an irregular portion 541 in a dimple shape, a groove shape, a line shape, a stripe shape, a mesh shape, or the like is joined and integrated by welding, bonding, or the like in advance as illustrated in FIG. 8(b), and thereafter a plated composite is formed in which a copper plating layer 3 is formed on the core 1 and the sheet-shaped member 540, and the plated composite is then subjected to a dissolution process. As the sheet-shaped member 540, a metal mesh or a porous material may be used, and its meshes or pores penetrating in the thickness direction may constitute the aforesaid irregular portion 541. As the sheet-shaped member 540, a member (gold, silver, copper, or the like) in a sheet shape (including a film shape, a foil shape, and the like) made of a material insoluble in a solvent which dissolves the core 1 is used. Consequently, as illustrated in FIG. 8(a), the sheet-shaped member 540 having the irregular portion 541 is fixed to an inner surface of a hollow part 54A formed by the copper plating layer 3, so that the irregular portion 541 is formed in a range where the sheet-shaped member 540 is integrated.

Further, as illustrated in FIG. 8(c), it is also possible to produce the hollow structure 54 by sandwiching the above-described sheet-shaped member 540 including the irregular portion 541 between two metal (aluminum or the like) foils 100, 100 (or two synthetic resin (polyimide or the like) films) to fabricate the core 1, plating this core 1, and thereafter processing the resultant in the above-described manner. In this case, when the core 1 (the metal foils 100, 100 or the like) is dissolved, the sheet-shaped member 540 remains without being fixed in the hollow part 54A. By disposing the sheet-shaped member 540 in the hollow part 54A, it is possible to form a wick having a capillary action. A work of inserting the sheet-shaped member into a narrow space whose inner surfaces have a distance of 1 mm or less is difficult to perform in a post-process. However, the use of the core 1 in which the sheet-shaped member is sandwiched between the metal foils or the synthetic resin films as described above makes it possible to easily dispose the sheet-shaped member 540 in the narrow space only by thereafter executing the completely the same steps as those described above such as the plating process of the core 1 and the dissolution process. Incidentally, the sheet-shaped member 540 is preferably disposed, being fixed to the inner surface of the hollow part 54A as illustrated in FIGS. 8(a), (b) in consideration of its function as the wick, but it is also possible to dispose it without being fixed, by adopting the method in FIG. 8(c).

The present invention is suitable for producing a thin or small-diameter hollow structure having a small thickness (small diameter) as described above, but for example, by using a plate material or a block body having a large thickness and a large shape as the core, it is also possible to apply the present invention to the production of a larger one such as, for example, a power module radiator and the like assembled in automobiles, railroads, solar battery systems, and the like. Further, in a case where a hollow structure used as an electronic apparatus component or the like is produced, if there are many stays in its hollow part, a dissolved core is difficult to flow out whether the hollow structure is thin or thick, but according to the present invention, irrespective of the thickness of the hollow structure (the size of the hollow part), the core can flow out quickly. Further, the hollow part and the hollow structure (skeletal part) may also have any of various shapes, and they can each have a triangular shape, a quadrangular shape, an elliptic shape, a star shape, other modified sectional shape, or the like in terms of the shape in the cross-sectional direction.

The invention claimed is:

1. A method for producing a hollow structure, the method comprising:
    producing a plated composite which is formed by plating a surface of a core and which has a plating layer, the plated composite having part of the core exposed from the plating layer; and
    turning a part corresponding to the core into a hollow part by dissolving and removing the core by a solvent which dissolves the core but does not dissolve the plating layer,
    thereby producing a hollow structure whose skeletal part is the plating layer,
    wherein the core is amphoteric metal and the solvent is an alkaline aqueous solution;
    wherein the core has a 0.001 to 1 mm thickness, and the plating layer has a 0.001 to 1 mm thickness,
    wherein the core is integrated with a sheet-shaped member made of a material insoluble in the solvent, and the sheet-shaped member is left in the hollow part by dissolving and removing the core,
    wherein the sheet-shaped member is sandwiched between two metal foils to fabricate the core, and
    further comprising a step of enclosing a heating medium in the hollow part in order for the hollow structure to be used as a radiator for an electronic apparatus.

2. The method for producing the hollow structure according to claim 1, wherein the amphoteric metal is aluminum or zinc.

3. The method for producing the hollow structure according to claim 1, wherein, the core has at least one through hole formed in a thickness direction is used.

4. The method for producing the hollow structure according to claim 1, wherein, the core has a surface on at least part of which an irregular portion is formed is used.

5. The method for producing the hollow structure according to claim 1, the method comprising covering at least part of the surface of the core with a corrosion-resistant metal layer and insoluble in the solvent before the plating, to cover at least part of an inner surface of the skeletal part made of the plating layer with the corrosion-resistant metal layer.

6. The method for producing the hollow structure according to claim 1, wherein the alkaline aqueous solution is a sodium hydroxide solution or a potassium hydroxide solution.

7. The method for producing the hollow structure according to claim 1, wherein the sheet-shaped member has, on its surface, an irregular portion that is joined and integrated to the core in advance.

8. The method for producing the hollow structure according to claim 1, wherein the core has a 0.001 to 0.5 mm thickness.

9. The method for producing the hollow structure according to claim 8, wherein the core has a 0.001 to 0.01 mm thickness.

* * * * *